United States Patent
Li et al.

(10) Patent No.: US 11,572,627 B2
(45) Date of Patent: Feb. 7, 2023

(54) MOLTEN AL—SI ALLOY CORROSION RESISTANT COMPOSITE COATING AND PREPARATION METHOD AND APPLICATION THEREOF

(71) Applicant: CHANGSHA UNIVERSITY OF SCIENCE & TECHNOLOGY, Hunan (CN)

(72) Inventors: Wei Li, Hunan (CN); Yilin Zhao, Hunan (CN); Jian Chen, Hunan (CN); Yanjie Ren, Hunan (CN); Jianjun He, Hunan (CN); Jianlin Chen, Hunan (CN)

(73) Assignee: CHANGSHA UNIVERSITY OF SCIENCE & TECHNOLOGY, Hunan (CN)

( * ) Notice: Subject to any disclaimer, the term of this patent is extended or adjusted under 35 U.S.C. 154(b) by 180 days.

(21) Appl. No.: 16/977,821

(22) PCT Filed: Mar. 3, 2020

(86) PCT No.: PCT/CN2020/077573
§ 371 (c)(1),
(2) Date: Sep. 3, 2020

(87) PCT Pub. No.: WO2020/207155
PCT Pub. Date: Oct. 15, 2020

(65) Prior Publication Data
US 2021/0071307 A1     Mar. 11, 2021

(30) Foreign Application Priority Data

Apr. 9, 2019   (CN) .......................... 201910281498.6

(51) Int. Cl.
| | |
|---|---|
| *C23C 28/00* | (2006.01) |
| *C23C 16/02* | (2006.01) |
| *C23C 16/455* | (2006.01) |
| *C23C 24/08* | (2006.01) |

(52) U.S. Cl.
CPC ...... *C23C 28/3455* (2013.01); *C23C 16/0227* (2013.01); *C23C 16/45529* (2013.01); *C23C 24/08* (2013.01)

(58) Field of Classification Search
CPC .............. C23C 10/50; C23C 16/45525; C23C 16/45529; C23C 16/45536
See application file for complete search history.

(56) References Cited

U.S. PATENT DOCUMENTS

| | | | | |
|---|---|---|---|---|
| 5,626,462 A | * | 5/1997 | Jackson | C23C 26/02 |
| | | | | 416/97 R |
| 2002/0187327 A1 | * | 12/2002 | Nagaraj | C23C 28/00 |
| | | | | 427/255.28 |
| 2015/0240343 A1 | * | 8/2015 | Medvedovski | C23C 10/48 |
| | | | | 428/336 |

FOREIGN PATENT DOCUMENTS

| | | |
|---|---|---|
| CN | 101061191 | 10/2007 |
| CN | 102190461 | 9/2011 |
| CN | 102191449 | 9/2011 |
| CN | 108048779 | 5/2018 |
| CN | 109943803 | 6/2019 |
| JP | H0841655 | 2/1996 |
| SU | 1569352 | 6/1990 |

OTHER PUBLICATIONS

Lian-Kui Wu, et al., "High temperature oxidation resistance of γ-TiAl alloy with pack aluminizing and electrodeposited SiO2 composite coating." Corrosion Science, vol. 146, Jan. 2019, pp. 18-27.

"International Search Report (Form PCT/ISA/210)" of PCT/CN2020/077573, dated May 22, 2020, pp. 1-5.

Written Opinion of the International Searching Authority (Form PCT/CN2020/077573, dated May 22, 2020, pp. 1-5.

* cited by examiner

*Primary Examiner* — Tabatha L Penny
(74) *Attorney, Agent, or Firm* — JCIP Global Inc.

(57) ABSTRACT

The invention provides a molten Al—Si alloy corrosion resistant composite coating and a preparation method and application thereof. The composite coating layer comprises an aluminized layer and a $TiO_2$ film layer from a surface of a substrate to the outside in sequence. The preparation method of the coating layer comprises the following steps: (step S1) making a surface treatment to an Fe-based alloy, and then aluminizing with a solid powder penetrant; (step S2) sand-blasting the aluminized Fe-based alloy; (step S3) washing and drying the Fe-based alloy which has been sand-blasted; and (step S4) depositing the $TiO_2$ film layer on a surface of the dried aluminized Fe-based alloy by using an atom layer vapor deposition. The application of the molten Al—Si alloy corrosion resistant composite coating is used for a solar thermal power generation heat exchange tube.

7 Claims, 3 Drawing Sheets

MOLTEN AL—SI ALLOY CORROSION RESISTANT COMPOSITE COATING AND PREPARATION METHOD AND APPLICATION THEREOF

CROSS-REFERENCE TO RELATED APPLICATION

This application is a 371 of international application of PCT application serial no. PCT/CN2020/077573, filed on Mar. 3, 2020, which claims the priority benefit of China application no. 201910281498.6, filed on Apr. 9, 2019. The entirety of each of the above mentioned patent applications is hereby incorporated by reference herein and made a part of this specification.

BACKGROUND

Technical Field

The present invention relates to the field of a corrosion resistant coating technology, in particular to a molten Al—Si alloy corrosion resistant composite coating with excellent properties and preparation method and application thereof.

Description of Related Art

Traditional fossil energy can no longer meet the needs under global population growth and rapid industrialization. For this reason, various governments have given close attention to the applications of renewable energy sources in the world. Compared with other renewable energy power generation technologies, solar thermal power generation has the advantages of thermal storage, peak regulation and continuous power generation, and is developing towards the goal of high photo-thermal conversion efficiency, low cost and long service life. High temperature thermal storage materials crucial to improve an operation efficiency of a solar thermal power generation system. Recently, vapor, molten salt and conduction oil are mainly applied as thermal storage mediums for commercial solar thermal power generation station. Due to the features of low thermal capacity of vapor, low thermal conductivity coefficient of molten salt, easy decomposition and solid-liquid layering at high temperature, and easiness to decompose conduction oil at high temperature (over 400° C.), the thermal storage system has the defects of low heat conducting efficiency, poor thermal stability, and high degree of supercooling, thereby leading to high power generation cost and limiting the development of solar thermal power generation. Al—12Si alloy is an ideal thermal storage material due to its proper phase change temperature, excellent thermal conduction and storage and abundant sources.

However, in practical use, a high temperature liquid of Al—Si alloy reacts with Fe to generate (Fe, Cr, Ni)$_2$Al$_5$ and (Fe, Cr, Ni)Al$_3$ compounds when contacting an Fe-based heat exchange tube. Moreover, Al easily penetrates through holes of (Fe, Cr, Ni)Al$_3$ and (Fe, Cr, Ni)$_2$Al$_5$ compounds to continuously react with Fe due to its small diameter, so as to continuously generate a (Fe, Cr, Ni)Al compound, which leads to the dissolution of metal elements. Meanwhile, Si in the Al—Si alloy also reacts with Fe and Al to generate Fe$_3$Si, Fe$_2$Al$_7$Si and other brittle phases, in order to further intensify the dissolution between metal and non-metal elements of a heat exchange pipe fitting, and finally cause corrosion damage. Hence, to improve the molten Al—Si alloy corrosion resistance of the heat exchange tube material is an urgent problem to be solved for the research and development of the solar thermal power generation.

Thermal insulation and corrosion resistance effects are generally implemented by coating a high temperature protective coating onto the heat exchange tube surface. Generally speaking, there are two molten alloy corrosion resistance mechanisms for the high temperature protective coating on a surface of a steel substrate, including a reaction protection mechanism and a non-reaction protection mechanism. For reactive protection, aluminizing is a mature chemical thermal treatment technology. After aluminum enters an alloy surface, an intermetallic compound (IMC) is formed, and a reaction diffusion area is formed on the surface; when oxidizing, an aluminide surface is provided with an Al$_2$O$_3$ thin film to prevent the continuous reaction between the substrate and the environment. However, the aluminized coating has such problems that a penetrated layer is usually too thin and loose, and is easily stripped due to the fact that it is not closely bonded with the substrate. Moreover, Si in the Al—Si alloy easily penetrates through the penetrated layer to react with the substrate to generate brittle phases enriched between the penetrated layer and the substrate, so that the aluminized coating embrittles to degrade the high temperature corrosion resistance. With respect to the patent application (application No.: 201010126855.0), a molten Al—Si alloy metal corrosion resistant coating is prepared by a high temperature coating method of coating and doping ceramic powder (such as SiO$_2$ and TiB$_2$) on a surface. On the one hand, a porosity of the coating prepared by the method is large, Al atoms easily penetrate through pores in the coating to contact a stainless steel substrate in the presence of a molten Al—Si alloy, so as to generate (Fe, Cr, Ni)$_2$Al$_5$ and (Fe, Cr, Ni)Al$_3$ brittle phases, and then fall off into the molten Al—Si alloy, wherein the new stainless steel substrate continuously reacts with the molten Al—Si alloy to repeatedly cause corrosion failure; on the other hand, an operating temperature of the molten Al—Si alloy is around 620° C. during the thermal storage, while TiB$_2$ reacts with an Fe substrate to generate a brittle layer (TiC+TiFe+ Fe$_2$B) at over 400° C., which causes the mechanical property of materials to decline sharply. In conclusion, there are significant disadvantages of the molten Al—Si alloy corrosion protection when single coating is applied to the heat exchange tube. For example, due to low bonding force between the coating and the substrate, the coating is easily peeled off, cannot completely isolate the substrate from the molten metal, and easily generates the brittle phases to lower structural stability and high temperature corrosion resistance.

As a barrier between the substrate and a corrosion medium, the composite coating has such excellent performances as wear resistance, high temperature resistance, and resistance to oxidation and corrosion, thereby being extensively applied to the fields of aerospace industry, equipment re-manufacturing industry, light industry, automobile industry and power generation industry. However, the current composite coating usually has such problems as easiness to fall off due to not tight bonding between the layers, defects in the coating structure and rough surface, easiness to generate cavities and cause microcracks failure, and uneven distribution of internal stress due to unmatched thermal expansion coefficients. For example, the document—*High Temperature Oxidation Resistance of γ-TiAl Alloy with Pack Aluminizing and Electrodeposited SiO$_2$ Composite Coating* (Corrosion Science, 2018) discloses a method for electroplating a SiO$_2$ coating onto an aluminized γ-TiAl alloy, wherein the composite coating can effectively improve the high temperature oxidation resistance, but the penetrated layer has long cracks perpendicular to the surface, the electroplated $SiO_2$ coating surface has many microcracks, which easily accelerates material failure in practical use. The patent (application No.: 201010126852.7) discloses a molten Al—Si alloy corrosion resistant gradient protective coating for solar power generation and preparation method thereof, wherein an MoB/CoCr gradient protective coating is prepared by low pressure plasma spraying. According to the method, the thermal shock resistance of the coating can be improved, but easily fall off due to not strong bonding force between it and a substrate interface. The patent (application No.: 201711388751.5) discloses a preparation method for internal heating evaporation basket with aluminum-liquid-corrosion-resistant composite ceramic coating. According to the patent, an $Al_2O_3$-8YSZ corrosion resistant coating in a 0.8~1.5 mm composite structure is sprayed using a thermal spraying technology. The composite coating is not moistened in the molten metal, and has the thermal corrosion resistance, but is insufficiently bonded with the substrate and the particle layers, so that the coating has a poor torsion resistance and a shear force resistance. Furthermore, the coating prepared by the thermal spraying is thick, and the increasing stress within the coating easily causes cracking and falling off of the coating.

SUMMARY

To overcome the disadvantages of the prior art, the technical problem to be solved by the present invention is to provide a composite coating which is even in tissues, small in internal stress, tight in bonding, small in coating porosity and is capable of isolating the bonding between the molten metal and the substrate, and excellent in molten Al—Si alloy corrosion resistance, and to further provide a method which has a simple process, and is capable of preparing the composite coating with small internal stress, strong bonding force between the penetrated layer and the substrate, good anti-stripping, and excellent corrosion resistance in the presence of molten Al—Si alloy.

To solve the above technical problem, the technical solution for the present invention is: to provide a molten Al—Si alloy corrosion resistant composite coating, wherein the composite coating comprises an aluminized layer and a $TiO_2$ thin film layer from a surface of a substrate to the outside in sequence.

According to the molten Al—Si alloy corrosion resistant composite coating, preferably, the composite coating further comprises an $Al_2O_3$ thin film layer prepared by an atom layer vapor deposition, and the $Al_2O_3$ thin film layer is located between the $TiO_2$ thin film layer and the aluminized layer. The $Al_2O_3$ thin film layer has a nano-scale thickness.

According to the molten Al—Si alloy corrosion resistant composite coating, preferably, the aluminized layer comprises an Fe(Al) phase diffusion layer, an Fe—Al compound layer and an $Al_2O_3$ layer from the substrate to the outside in sequence. The Fe(Al) phase diffusion layer, the Fe—Al compound layer and the $Al_2O_3$ layer have a micro-sized thickness.

As an overall inventive concept, the present invention further provides a preparation method for a molten Al—Si alloy corrosion resistant composite coating, comprising the following steps:

step S1: making a surface treatment to an Fe-based alloy, and then aluminizing with a solid powder penetrant;

step S2: sand-blasting the aluminized Fe-based alloy;

step S3: washing and drying the Fe-based alloy which has been sand-blasted;

step S4: depositing the $TiO_2$ thin film layer on a surface of the dried aluminized Fe-based alloy by using an atom layer vapor deposition.

The preparation method for the molten Al—Si alloy corrosion resistant composite coating, preferably, further comprises depositing the $Al_2O_3$ thin film layer onto a surface of the aluminized Fe-based alloy in step S3 by using an atom layer vapor deposition between the step S3 and the step S4.

According to the preparation method for the molten Al—Si alloy corrosion resistant composite coating, preferably, in the step S1, the solid powder penetrant is a homogeneous mixture comprising the following ingredients: an aluminum powder with a granularity of 200 meshes, a filler consisting of a $Al_2O_3$ powder and a Cr powder and a powdery $NH_4Cl$ penetration aid, wherein the solid powder penetrant, by mass, comprises 42-74% of he aluminum powder, 20-40% of he $Al_2O_3$ powder, 5-15% of the Cr powder and 1-3% of he $NH_4Cl$. The aluminizing conditions include: maintaining a temperature at 400-600° C. for 20-40 min, and then maintaining a temperature at 900° C.-1050° C. for 10-15 h, and finally cooling to a room temperature along with a furnace.

According to the preparation method for the molten Al—Si alloy corrosion resistant composite coating, preferably, in the step S3, the step of depositing the $TiO_2$ thin film layer comprises: taking titanium isopropylate as a precursor and pressure as 0.1-0.3 torr, inflating for 0.1-0.5 s, exhausting air for 30-50 s, charging plasma vapor for 0.01-0.03 s, and finally exhausting air for 30-50 s and repeating titanium isopropylate inflating –exhausting air-vapor charging-exhausting air for recycling to deposit the $TiO_2$ thin film layer, wherein the repeating times are 50-500 times.

According to the preparation method for the molten Al—Si alloy corrosion resistant composite coating, preferably, the step of depositing the $Al_2O_3$ thin film layer comprises: taking trimethyl aluminum as a precursor and pressure as 0.05-0.2 torr, inflating for 0.01-0.03 s, and then exhausting air for 40-60 s, charging vapor for 0.01-0.03 s, and finally exhausting air for 20-60 s, and repeating trimethyl aluminum inflating-exhausting air-vapor charging-exhausting air to deposit the $Al_2O_3$ thin film layer; wherein the repeating times are 50-500 times.

According to the method for preparing the molten Al—Si alloy corrosion resistant composite coating, preferably, in the step S2, the sand-blasting is conducted at a high pressure nitrogen of 0.6-0.9 MPa, the sand-blasting time is 5-20 min, the sand-blasting abrasive is $Al_2O_3$ particles with 300-500 meshes, and the sand-blasting distance is 2-6 cm; in the step S1, the surface treatment includes mechanical polishing for the Fe-based alloy before electrolytic polishing; the mechanical polishing comprises: polishing without visually obvious scratches by using an abrasive paper with a granularity of 80-1,200 meshes, ultrasonically washing for 5-20 min with acetone, and then ultrasonically washing with anhydrous ethanol for 5-20 min, and finally drying; the electrolytic polishing means electrolytically polishing an Fe base by taking the Fe-based alloy as an anode and an insoluble conductive material as a cathode; the electrolytically polished electrolyte comprises concentrated sulfuric acid with a volume fraction of 60-80%, concentrated phosphoric acid with a volume fraction of 15-37% and distilled water with a volume fraction of 3-5%; the electrolytic DC voltage is 5-6 V, the temperature of the electrolyte is 60-80° C., and the electrolytic polishing time is 2-5 min.

As an overall invention concept, the present invention further provides an application for a solar thermal power generation heat exchange tube by using the aforesaid molten Al—Si alloy corrosion resistant composite coating or the molten Al—Si alloy corrosion resistant composite coating prepared by the aforesaid preparation method for the molten Al—Si alloy corrosion resistant composite coating.

Compared with the prior art, the present invention has the following advantages: 1. The solar thermal power generation heat exchange tube with an Al—Si alloy as a thermal storage medium requires high molten Al—Si alloy corrosion resistance and certain mechanical strength in a molten Al—Si alloy using environment at a high temperature (620° C.). The coating provided by the present invention comprises an aluminized layer and a $TiO_2$ thin film layer from the substrate surface to the outside in sequence. The composite coating has even tissues without cracks, ingredients smoothly transiting between the penetrated layers in a gradient manner, small interface stress between the substrate and the penetrated layers, small tissue defects, strong bonding force and good structural stability, thereby effectively isolating the substrate from the molten metal; the $TiO_2$ thin film layer deposited on the aluminized layer surface, especially the $TiO_2$ thin film layer obtained by the atom layer vapor deposition, has an even and compact surface, which can further prevent the penetration of the molten metal; furthermore, Si in the Al—Si alloy reacts with titanium dioxide to form a Ti—Si—O solid solution capable of effectively restraining particle movement, increasing crystal phase change barrier potential, preventing $TiO_2$ from phase changing, ensuring $TiO_2$ anatase structure to be stable, and effectively preventing the diffusion of the Al and Si elements, thereby being capable of ensuring excellent molten Al—Si alloy corrosion resistance.

2. The composite coating provided by the present invention is introduced into the $Al_2O_3$ thin film layer by using the atom layer vapor deposition between the aluminized layer and the $TiO_2$ thin film layer; an aluminum oxide thin film subject to atom layer deposition is strong in step coverage, which effectively fills the cracks and gaps of the oxidation film on the penetrated layer surface, forms the complete and compact aluminum oxide film, and more effectively blocks the diffusion of aluminum atom; a thermal expansion coefficient of $Al_2O_3$ is between an Fe—Al phase and $TiO_2$ at 620° C., which can effectively prevent heat fatigue cracks or extension caused by mismatching thermal expansion coefficient.

3. In the composite coating provided by the present invention, the aluminized layer comprises the Fe(Al) phase diffusion layer, the Fe—Al compound layer (namely, Fe—Al external penetrated layer) and $Al_2O_3$ layer, from inside to outside from the substrate surface; the gradients between the penetrated layers smoothly transit in a gradient manner, which obviously lowers the interface stress between the substrate and the penetrated layers, and effectively improves the bonding force between the penetrated layers.

4. According to the present invention, a composite coating structure of the $TiO_2$ thin film layer and the aluminized layer, comprising the Fe(Al) phase diffusion layer, the Fe—Al compound layer and the $Al_2O_3$ layer from the substrate to the surface layer sequentially, is prepared through a $TiO_2$ thin film layer process route of aluminizing-sand-blasting-cleaning-atom layer vapor deposition. The composite coating has even tissues without cracks, ingredients smoothly transiting between the penetrated layers in a gradient manner, small interface stress between the substrate and the penetrated layers, small tissue defects, strong bonding force, and good structural stability, thereby effectively isolating the substrate from the molten metal. The $Al_2O_3$ film layer is deposited on the aluminized layer surface cleaned by the atom layer vapor deposition, and then introduced into the $TiO_2$ thin film layer to further improve the chemical inertness of the composite coating, thereby blocking Al and Si atoms from diffusing to the substrate; The aluminum oxide thin film subject to atom layer deposition is strong in step coverage, effectively fills the cracks and gaps on the oxide films of the penetrated layer surface, forms the complete and compact aluminum oxide film, more effectively blocks aluminum atom diffusion and provides a good surface condition to subsequently introduce the $TiO_2$ thin film layer. The introduced $TiO_2$ thin film layer has a compact surface and even tissues without microcracks, thereby being beneficial to preventing Si element diffusion, and improving structural stability and corrosion resistance of the coating in the presence of high temperature corrosion.

5. According to the method provided by the present invention, the tissue controlling precision can be effectively improved by further controlling penetrant composition and aluminizing conditions, namely, the thicknesses and microstructures of the Fe(Al) phase diffusion layer, the Fe—Al compound layer and the $Al_2O_3$ layer in the aluminizing tissues are controlled to obtain the aluminized coating with more even tissues, small internal stress and tighter bonding composite coating, thereby being capable of effectively reducing the interfacial stress between the substrate and the penetrated layer and the tissue defects, improving the bonding force between the substrate and the penetrated layer, restraining the falling off of the penetrated layer, crack initiation and extension, and obtaining the penetrated layer structure with good tissue compactness and integrity. The compact and uniform $Al_2O_3$ thin film layer and the $TiO_2$ thin film layer without surface defects can be obtained by controlling the process parameters of the $Al_2O_3$ thin film layer and the $TiO_2$ thin film layer subject to the atom layer vapor deposition, which can effectively preventing melts from entering the coating, and effectively improving the melt blockage; furthermore, the two layers are bound to the aluminized layer tightly, which can effectively improve the stability of the composite coating; Coating defects can be effectively reduced by mechanical polishing and electrolytic polishing on the aluminized layer, and further controlling the sand-blasting time and the sand-blasting distance, and the process parameters of the mechanical polishing and electrolytic polishing and so on. This can further improve the bonding strength between the substrate and the surface, the structural stability and compactness of the aluminized layer and the bonding force between the aluminized layer and the coating subject to the atom layer vapor deposition, and improve resistance to stripping, mechanical property and melt corrosion resistance.

DESCRIPTION OF THE EMBODIMENTS

The present invention will be further clarified based on the following figures and embodiments.

According to a molten Al—Si alloy corrosion resistant composite coating provided by the present invention, the composite coating comprises an aluminized layer and a $TiO_2$ thin film layer from a substrate surface to the outside in sequence. Particularly, the substrate of the present invention is made of a Fe-based material, preferably austenitic stainless steel. The $TiO_2$ thin film layer is preferably introduced by an atom layer vapor deposition. The $TiO_2$ thin film layer introduced using this method has a compact surface, and even tissues without microcracks and so on. The $TiO_2$ thin film layer can be controlled to be in nanometer scale, so as to improve the performance of the composite coating, preferably 5-50 nm. On the one hand, due to high production cost of the precursor for the atom layer deposition, the thickness of the $TiO_2$ thin film can be controlled within a small scope to lower the production cost of the composite coating while ensuring the coating to exert an effective protection role; on the other hand, the anatase crystal structure is more regular, and gaps between unit cells can be ignored, both of which are very beneficial to preventing the diffusion of the Si element.

The coating further includes $Al_2O_3$ thin film layer prepared by the atom layer vapor deposition, and the $Al_2O_3$ thin film layer is located between the $TiO_2$ thin film layer and the aluminized layer; the $Al_2O_3$ thin film layer, which is a continuous compact coating prepared by the atom layer vapor deposition, is arranged between the aluminized layer and the $TiO_2$ thin film layer.

The $Al_2O_3$ thin film layer has a nanoscale thickness; preferably, the $Al_2O_3$ thin film layer provided by the present invention has a thickness of 5-50 nm.

The aluminized layer includes an Fe(Al) phase diffusion layer, an Fe—Al compound layer and an $Al_2O_3$ layer from the substrate to the outside sequentially; the thicknesses of the Fe(Al) phase diffusion layer, the Fe—Al compound layer and the $Al_2O_3$ layer are in micron scale; the Fe(Al) phase diffusion layer, also called Al-containing Fe diffusion layer, is essentially a diffusion layer formed by diffusing Al to the substrate to replace Fe atoms partially on the surface of the substrate, and is a depleted Al area with a low Al content; an atomic percent of the Al element in the diffusion layer is raised to 8 at. % outermost the Fe(Al) phase diffusion layer from 0 at. % on the substrate surface. The $Al_2O_3$ layer is a non-continuous coating capable of exerting antioxidant isolation, and but also inducing heat fatigue crack initiation, but also lowering the molten Al corrosion resistance due to oxidation etching grooves on the surface.

Preferably, the Fe—Al compound layer has a thickness of 60-200 μm; the Fe(Al) phase diffusion layer has a thickness of 50-160 μm; the $Al_2O_3$ layer has a thickness of 10-30 μm; the Fe—Al compound comprises FeAl, $FeAl_2$ and $Fe_3Al$.

A method for preparing the molten Al—Si corrosion resistant coating provided by the present invention, comprising the following steps:

step S1: making a surface treatment to an Fe-based alloy, and then aluminizing with a solid powder penetrant;

step S2: sand-blasting the aluminized Fe-based alloy;

step S3: washing and drying the Fe-based alloy which has been sand-blasted;

step S4: depositing the $TiO_2$ thin film layer on a surface of the dried aluminized Fe-based alloy by using an atom layer vapor deposition.

In this solution, the Fe-based alloy is made of an alloy plate, preferably austenitic stainless steel.

Between the step S3 and the step S4, there is also a step of depositing the $Al_2O_3$ thin film layer onto the aluminized Fe-based alloy surface obtained in the step S3 by the atom layer vapor deposition, wherein the $Al_2O_3$ thin film layer introduced by the method is compact and uniform, and is capable of strengthening the isolation of the substrate, remedying the defect that the $Al_2O_3$ layer has oxidation etching grooves on the surface of the aluminized coating obtained by an aluminizing method, etc. This defect not only easily induces the heat fatigue crack initiation, but also lowers the molten Al corrosion resistance. According to the present invention, the $Al_2O_3$ thin film layer subject to atom deposition is deposited by the atom deposition to supplement the non-continuous $Al_2O_3$ thin film layer on the penetrated layer, so that the continuous and compact $Al_2O_3$ film covers a specimen surface, which realizes the effect of blocking the Al atom diffusion, and provides a good surface environment to subsequently deposit the $TiO_2$ thin film, so as to prevent other interfere elements from affecting the deposition effect; and meanwhile, this is good for lowering the interfacial stress and improving the bonding force and stability between the coatings.

In the step S1, the solid powder penetrant is a homogeneous mixture comprising the following ingredients: an aluminum powder with a granularity of 200 meshes, a filler consisting of a $Al_2O_3$ powder and a Cr powder and a powdery $NH_4Cl$ penetration aid, wherein the solid powder penetrant, by mass, comprises 42-74% of the aluminum powder, 20-40% of the $Al_2O_3$ powder, 5-15% of the Cr powder and 1-3% of the $NH_4Cl$. The tissue controlling precision can be effectively improved by the solid powder penetrant using this ingredient, so as to further improve the tissue compactness and integrity.

The aluminizing conditions include: drying for 2 h at 150° C.; maintaining a temperature at 400-600° C. for 20-40 min, wherein a heating rate is 10° C./min; maintaining a temperature at 900° C.-1050° C. for 10-15 h; and finally cooling to the room temperature along with the furnace. The control for the thicknesses and microstructures of the Fe(Al) phase diffusion layer, the Fe—Al compound layer and the $Al_2O_3$ layer can be further improved to obtain the aluminized coating with more even tissues, small internal stress and more tight to bond with the composite coatings.

In the step S4, the step of depositing the $TiO_2$ thin film layer comprises: heating a cavity to 300-450° C.; taking titanium isopropylate (purity of 99.99%) as the precursor and pressure as 0.1-0.3 torr, inflating for 0.1-0.5 s, exhausting air for 30-50 s, charging plasma vapor for 0.01-0.03 s, and finally exhausting air for 30-50 s, depositing the $TiO_2$ thin film layer, and repeating titanium isopropylate inflating-exhausting air-vapor charging-exhausting air for recycling to deposit the $TiO_2$ thin film layer; the times of controlling the cycle are 50-500 times, and thus the $TiO_2$ thin film layer of different thicknesses can be generated.

The step of depositing the $Al_2O_3$ thin film layer comprises: placing an aluminized steel as a substrate into an equipment cavity, and heating the cavity to 150-300° C.; taking trimethyl aluminum (TMA) (purity of 99.99%) as a precursor and pressure as 0.05-0.2 torr, inflating for 0.01-0.03 s, and then exhausting air for 40-60 s, charging vapor for 0.01-0.03 s, and finally exhausting air for 20-60 s, and depositing the $Al_2O_3$ thin film layer; repeating trimethyl aluminum inflating-exhausting air-vapor charging-exhausting air to deposit the $Al_2O_3$ thin film layer; the times of controlling the cycle are 50-500 times, and thus the $Al_2O_3$ thin film layer of different thicknesses can be generated.

In the step S2, the sand-blasting is conducted at a high pressure nitrogen of 0.6-0.9 MPa; the sand-blasting time is 5-20 min; the sand-blasting abrasive is $Al_2O_3$ particles with 300-500 meshes; the sand-blasting distance is 2-6 cm. Fluffy surface layer and impurities on the aluminized layer surface can be effectively removed by controlling sand-blasting pressure and sand-blasting time, so as to obtain even aluminized tissues with strong bonding force, and provide the aluminum oxide film subject to atom layer deposition with the excellent substrate doped with no external elements, thereby improving the bonding efficiency between the reactive precursor and the substrate.

In the step S1, the surface treatment includes mechanical polishing for the Fe-based alloy before electrolytic polishing; the mechanical polishing comprises: polishing without visually obvious scratches using an abrasive paper with a granularity of 80-1,200 meshes, ultrasonically washing for 5-20 min to remove oil with acetone, and then ultrasonically washing with anhydrous ethanol to remove the stains for 5-20 min, and finally drying; the electrolytic polishing means electrolytically polishing the Fe base by taking the Fe-based alloy as an anode and an insoluble conductive material as a cathode; the electrolytically polished electrolyte comprises concentrated sulfuric acid with a volume fraction of 60-80%, concentrated phosphoric acid with a volume fraction of 15-37% and distilled water with a volume fraction of 3-5%; the electrolytic DC voltage is 5-6 V, the electrolyte temperature is 60-80° C., and the electrolytic polishing time is 2-5 min.

The electropolishing treatment is as follows: connecting a 321 austenitic stainless steel plate to the anode at a distance of 50 mm from the cathode made of an insoluble conductive material (graphite plate); heating the electrolyte to 60-80° C. (optionally, by water bath) and placing the anode and the cathode in the electrolyte; switching on a 5-6 V DC voltage and taking out the plate after 2-5 min; and then rinsing and drying the plate. The electrolyte comprises the following compositions (by volume fraction): 60-80% of concentrated sulfuric acid (98% pure), 15-37% of concentrated phosphoric acid (85% pure) and 3-5% of distilled water.

The step S3 is as follows: placing the test piece in a beaker containing 3-8 L of deionized water and heating and oscillating for 2-7 min to remove residual fines from the surface of the test piece; transferring the test piece to another beaker containing 2-5 L of acetone for 5-10 min heating and oscillation; and then drying the test piece for 10-30 min by means of a drying oven.

According to the preparation method for the composite coating with high resistance to a molten Al—Si alloy corrosion provided by the present invention, the aluminum-diffused stainless steel is subject to an atom layer vapor deposition to obtain a coating in multilayer structure, comprising a $TiO_2$ thin film with a thickness of 5 nm-50 nm, an $Al_2O_3$ thin film with a thickness of 5 nm-50 nm, a discontinuous $Al_2O_3$ layer with a thickness of 10-30 μm, an Fe—Al outer aluminized layer with a thickness of 60-200 μm (FeAl, $FeAl_2$ and $Fe_3Al$), a diffusion layer comprising Fe(Al) phase with a thickness of 50-160 μm and a substrate from the outside inwards. The layers of the composite coating are tightly integrated with sharply defined and regular boundaries and free of crack. The $Al_2O_3/TiO_2$ thin film or $TiO_2$ thin film obtained by atom layer vapor deposition is controllable in thickness and grows in a uniform and smooth way with a good step coverage. With compact surface, the thin film is firmly adhered on the aluminized layer structure without changing the aluminized layer structure. The 72-hour molten Al—Si alloy corrosion test was conducted at 620° C. and revealed a corrosion rate of $0.35 \times 10^{-5}$ g/mm²·h for the obtained stainless steel with the $Al_2O_3/TiO_2$ thin film coating structure and $0.23 \times 10^{-5}$ g/mm²·h for the stainless steel with the $TiO_2$ thin film coating structure, which decreased by 73.1% and 82.3% with respect to the corrosion rate of austenitic stainless steel ($1.3 \times 10^{-5}$ g/mm²·h). Therefore, the obtained stainless steel has excellent resistance to corrosion of the molten Al—Si alloy, guarantees the compatibility of the molten Al—Si alloy (as a heat reservoir medium) to a heat exchange tube for solar thermal power generation, and promises extraordinary scientific merits and industrial application.

Embodiment 1

According to a molten Al—Si alloy corrosion resistant composite coating provided by the present invention, the composite coating comprises an aluminized layer, an $Al_2O_3$ thin film layer and a $TiO_2$ thin film layer from a substrate surface to outside in sequence. The $Al_2O_3$ thin film layer with thickness of 5 nm and the $TiO_2$ thin film layer with thickness of 20 nm are introduced by means of an atom layer vapor deposition; the aluminized layer comprises an Fe(Al) phase diffusion layer, an Fe—Al compound layer and an $Al_2O_3$ layer from the substrate surface to outside in sequence. The Fe(Al) phase diffusion layer, the Fe—Al compound layer and the $Al_2O_3$ layer have micro-sized thicknesses.

A preparation method for the molten Al—Si alloy corrosion resistant composite coating of this embodiment, comprising the following steps:

(1) Surface mechanical polishing: polishing a hot-rolled austenitic stainless steel plate test piece to remove visible scratches using an abrasive paper with a granularity varying from 80 to 1200 meshes, ultrasonically washing the test piece in acetone for 5 min to remove oil, then transferring the test piece to an absolute ethyl alcohol to ultrasonically remove the stain for 5 min, and drying the test piece in a drying oven at 80° C. for 20 min; and the 321 austenitic stainless steel is a rolled plate, comprising the following chemical components (by mass fraction): 0.04% of C, 0.38% of Si, 1.08% of Mn, 17.02% of Cr, 9.06% of Ni, 0.05% of N, 0.03% of P, 0.22% of Ti and the rest of Fe.

(2) Electropolishing: connecting the 321 austenitic stainless steel plate to an anode at a distance of 50 mm from a cathode made of an insoluble conductive material (graphite plate), heating an electrolyte to 60° C. (optionally, by water bath), immersing the anode and the cathode in the electrolyte simultaneously, switching on a 5 V DC voltage, and then rinsing and drying the test piece after 2 min; and the electrolyte comprises the following compositions (by volume fraction): 60% of concentrated sulfuric acid (98% pure), 37% of concentrated phosphoric acid (85% pure) and 3% of distilled water.

(3) Aluminizing: a solid powder penetrant comprises an aluminum source, a filler and a penetration aid (activator); the aluminum source comprises an aluminum powder (200 meshes), the filler comprises an $Al_2O_3$ powder and a Cr powder, and the penetration aid comprises a powdered $NH_4Cl$; and the solid powder penetrant is prepared by fully mixing these components (percentage by weight): 5 wt % of Cr, 64 wt % of Al, 28 wt % of $Al_2O_3$ and 3 wt % of $NH_4Cl$. The penetrant is placed in a heat-resistant stainless steel charging bucket with the test piece in a compacted manner, and then sealed using a refractory mortar for aluminizing: heating up the test piece with the furnace to 150° C. and drying for 2 h, maintaining a temperature at 400° C. for 20 min and 900° C. for 15 h at a rate of 10° C./min, and then cooling the test piece with the furnace to room temperature;

(4) Sandblasting treatment: with $Al_2O_3$ particles (300 meshes) as an abrasive, sandblasting the aluminized test piece by a 0.6 MPa high-pressure nitrogen for 5 min at a distance of 6 cm to remove loose aluminized layer and impurities;

(5) Washing and drying with organic solvents: placing the test piece in a beaker containing 3 L of deionized water and heating and oscillating for 7 min to remove residual fines from the surface of the test piece; transferring the test piece to another beaker containing 5 L of acetone for 10-min heating and oscillation; and then drying the test piece for 30 min by means of a drying oven.

(6) $Al_2O_3/TiO_2$ thin film by means of atom layer vapor deposition: placing the aluminized steel into a chamber of equipment as a substrate, heating up to 150° C., taking trimethyl aluminum (TMA, 99.99% pure) as a precursor, inflating for 0.03 s and then vacuumizing for 40 s under a pressure of 0.05 torr, introducing a vapor for 0.01 s, and then vacuumizing for 30 s to deposit the $Al_2O_3$ thin film; and repeating 50 cycles of inflation-vacuumization-vapor introduction-vacuumization in the presence of the TMA until the $Al_2O_3$ thin film reaches the desired thickness of 5 nm; with the aluminized steel/$Al_2O_3$ thin film as a substrate, heating up the chamber to 300° C., taking a titanium isopropylate (99.99% pure) as a precursor, inflating for 0.5 s and then vacuumizing for 30 s under a pressure of 0.1 torr, introducing a water-vapor plasma for 0.01 s, and then vacuumizing for 30 s to deposit the $TiO_2$ thin film; and repeating 200 cycles of inflation-vacuumization-vapor introduction-vacuumization in the presence of the titanium isopropylate until the $TiO_2$ thin film reaches the desired thickness of 20 nm.

Embodiment 2

According to a molten Al—Si alloy corrosion resistant composite coating provided by the present invention, the composite coating comprises an aluminized layer, an $Al_2O_3$ thin film layer and a $TiO_2$ thin film layer from a substrate surface to outside in sequence. The $Al_2O_3$ and the $TiO_2$ thin film layers with thicknesses of 30 nm and 50 nm are introduced by means of an atom layer vapor deposition; the aluminized layer comprises an Fe(Al) phase diffusion layer, an Fe—Al compound layer and an $Al_2O_3$ layer from the substrate surface to outside in sequence. The Fe(Al) phase diffusion layer, the Fe—Al compound layer and the $Al_2O_3$ layer have micro-sized thicknesses.

A preparation method for the molten Al—Si alloy corrosion resistant composite coating of this embodiment, comprising the following steps:

(1) Surface mechanical polishing: polishing a hot-rolled austenitic stainless steel plate test piece to remove visible scratches using an abrasive paper with a granularity varying from 80 to 1200 meshes, ultrasonically washing the test piece in acetone for 10 min to remove the oil, then transferring the test piece to an absolute ethyl alcohol to ultrasonically remove the stain for 10 min, and drying the test piece in a drying oven at 80° C. for 30 min; and the 321 austenitic stainless steel is a rolled plate, comprising the following chemical components (by mass fraction): 0.04% of C, 0.38% of Si, 1.08% of Mn, 17.02% of Cr, 9.06% of Ni, 0.05% of N, 0.03% of P, 0.22% of Ti and the rest of Fe.

(2) Electropolishing: connecting the 321 austenitic stainless steel plate to an anode at a distance of 50 mm from a cathode made of an insoluble conductive material (graphite plate), heating an electrolyte to 70° C. (optionally, by water bath), immersing the anode and the cathode in the electrolyte simultaneously, switching on a 5 V DC voltage, and then rinsing and drying the test piece after 5 min; and the electrolyte comprises the following compositions (by volume fraction): 70% of concentrated sulfuric acid (98% pure), 26% of concentrated phosphoric acid (85% pure) and 4% of distilled water.

(3) Aluminizing: a solid powder penetrant comprises an aluminum source, a filler and a penetration aid (activator); the aluminum source comprises an aluminum powder (200 meshes), the filler comprises an $Al_2O_3$ powder and a Cr powder, and the penetration aid comprises a powdered $NH_4Cl$; and the solid powder penetrant is prepared by fully mixing these components (percentage by weight): 15 wt % of Cr, 44 wt % of Al, 40 wt % of $Al_2O_3$ and 1 wt % of $NH_4Cl$. The penetrant is placed in a heat-resistant stainless steel charging bucket with the test piece in a compacted manner, and then sealed using a refractory mortar for aluminizing: heating up the test piece with the furnace to 150° C. and drying for 2 h, maintaining a temperature at 600° C. for 40 min and 1050° C. for 10 h at a rate of 10° C./min, and then cooling the test piece with the furnace to room temperature;

(4) Sandblasting treatment: with $Al_2O_3$ particles (400 meshes) as an abrasive, sandblasting the aluminized test piece by a 0.8 MPa high-pressure nitrogen for 10 min at a distance of 4 cm to remove loose aluminized layer and impurities.

(5) Washing and drying with organic solvents: placing the test piece in a beaker containing 8 L of deionized water and heating and oscillating for 7 min to remove residual fines from the surface of the test piece; transferring the test piece to another beaker containing 5 L of acetone for 10-min heating and oscillation; and then drying the test piece for 30 min by means of a drying oven.

(6) $Al_2O_3/TiO_2$ thin film by means of atom layer vapor deposition: placing the aluminized steel into a chamber of equipment as a substrate, heating up to 300° C., taking a TMA (99.99% pure) as a precursor, inflating for 0.01 s and then vacuumizing for 60 s under a pressure of 0.2 torr, introducing a vapor for 0.03 s, and then vacuumizing for 50 s to deposit the $Al_2O_3$ thin film; and repeating 300 cycles of inflation-vacuumization-vapor introduction-vacuumization in the presence of the TMA until the $Al_2O_3$ thin film reaches the desired thickness of 30 nm; with the aluminized steel/$Al_2O_3$ thin film as a substrate, heating up the chamber to 450° C., taking titanium isopropylate (99.99% pure) as a precursor, inflating for 0.5 s and then vacuumizing for 50 s under a pressure of 0.3 torr, introducing a water-vapor plasma for 0.03 s, and then vacuumizing for 50 s to deposit the $TiO_2$ thin film; and repeating 500 cycles of inflation-vacuumization-vapor introduction-vacuumization in the presence of the titanium isopropylate until the $TiO_2$ thin film reaches the desired thickness of 50 nm.

Embodiment 3

According to a molten Al—Si alloy corrosion resistant composite coating provided by the present invention, the composite coating comprises an aluminized layer, an $Al_2O_3$ thin film layer and a $TiO_2$ thin film layer from a substrate surface to outside in sequence. The $Al_2O_3$ thin film layer with thickness of 10 nm and the $TiO_2$ thin film layer with thickness of 10 nm are introduced by means of an atom layer vapor deposition; The aluminized layer comprises an Fe(Al) phase diffusion layer, an Fe—Al compound layer and an $Al_2O_3$ layer from the substrate surface to outside in sequence. The Fe(Al) phase diffusion layer, the Fe—Al compound layer and the $Al_2O_3$ layer have micro-sized thicknesses.

A preparation method for the molten Al—Si alloy corrosion resistant composite coating of this embodiment, comprising the following steps:

(1) Surface mechanical polishing: polishing a hot-rolled austenitic stainless steel plate test piece to remove visible scratches using an abrasive paper with a granularity varying from 80 to 1200 meshes, ultrasonically washing the test piece in acetone for 20 min to remove oil, then transferring the test piece to an absolute ethyl alcohol to ultrasonically remove the stain for 20 min, and drying the test piece in a drying oven at 80° C. for 40 min; and the 321 austenitic stainless steel is a rolled plate, comprising the following chemical components (by mass fraction): 0.04% of C, 0.38% of Si, 1.08% of Mn, 17.02% of Cr, 9.06% of Ni, 0.05% of N, 0.03% of P, 0.22% of Ti and the rest of Fe.

(2) Electropolishing: connecting the 321 austenitic stainless steel plate to an anode at a distance of 50 mm from a cathode made of an insoluble conductive material (graphite plate), heating an electrolyte to 80° C. (optionally, by water bath), immersing the anode and the cathode in the electrolyte simultaneously, switching on a 5 V DC voltage, and then rinsing and drying the test piece after 3 min; the electrolyte comprises the following compositions (by volume fraction): 80% of concentrated sulfuric acid (98% pure), 15% of concentrated phosphoric acid (85% pure) and 5% of distilled water.

(3) Aluminizing: a solid powder penetrant comprises an aluminum source, a filler and a penetration aid (activator); the aluminum source comprises an aluminum powder (200 meshes), the filler comprises an $Al_2O_3$ powder and a Cr powder, and the penetration aid comprises a powdered $NH_4Cl$; and the solid powder penetrant is prepared by fully mixing these components (percentage by weight): 10 wt % of Cr, 58 wt % of Al, 30 wt % of $Al_2O_3$ and 2 wt % of $NH_4Cl$. The penetrant is placed in a heat-resistant stainless steel charging bucket with the test piece in a compacted manner, and then sealed using a refractory mortar for aluminizing: heating up the test piece with the furnace to 150° C. and drying for 2 h, maintaining a temperature of 500° C. for 30 min and 950° C. for 12 h at a rate of 10° C./min, and then cooling the test piece with the furnace to room temperature;

(4) Sandblasting treatment: with $Al_2O_3$ particles (500 meshes) as an abrasive, sandblasting the aluminized test piece by a 0.9 MPa high-pressure nitrogen for 5 min at a distance of 2 cm to remove loose aluminized layer and impurities;

(5) Washing with organic solvents: placing the test piece in a beaker containing 5 L of deionized water and heating and oscillating for 5 min to remove residual fines from the surface of the test piece; transferring the test piece to another beaker containing 4 L of acetone for 8-min heating and oscillation; and then drying the test piece for 20 min by means of a drying oven.

(6) $Al_2O_3/TiO_2$ thin film by means of atom layer vapor deposition: placing the aluminized steel into a chamber of equipment as a substrate, heating up to 200° C., taking a TMA (99.99% pure) as a precursor, inflating for 0.02 s and then vacuumizing for 45 s under a pressure of 0.1 torr, introducing a vapor for 0.015 s, and then vacuumizing for 45 s to deposit the $Al_2O_3$ thin film; and repeating 90 cycles of inflation-vacuumization-vapor introduction-vacuumization in the presence of the TMA until the $Al_2O_3$ thin film reaches a thickness of approximately 10 nm; with the aluminized steel/$Al_2O_3$ thin film as a substrate, heating up the chamber to 370° C., taking titanium isopropylate (99.99% pure) as a precursor, inflating for 0.25 s and then vacuumizing for 40 s under a pressure of 0.2 torr, introducing a water-vapor plasma for 0.02 s, and then vacuumizing for 40 s to deposit the $TiO_2$ thin film; and repeating 90 cycles of inflation vacuumization-vapor introduction-vacuumization in the presence of the titanium isopropylate until the $TiO_2$ thin film reaches a thickness of approximately 10 nm.

Embodiment 4

A molten Al—Si alloy corrosion resistant composite coating provided by the present invention, characterized by excluding the $Al_2O_3$ thin film layer introduced by means of the atom layer vapor deposition, based on comparison with the composite coating of Embodiment 3.

A preparation method for the molten Al—Si alloy corrosion resistant composite coating of the embodiment, characterized in that the method is basically identical with that of Embodiment 3, except that the $Al_2O_3$ thin film layer introduced by means of the atom layer vapor deposition is deleted from step (6), and the $TiO_2$ thin film layer is directly formed on the surface of the aluminized steel by means of the atom layer vapor deposition.

Comparative Example 1

A molten Al—Si alloy corrosion resistant composite coating, characterized by comprising the aluminized layer only rather than the $Al_2O_3$ and the $TiO_2$ thin film layers introduced by means of the atom layer vapor deposition, based on comparison with the composite coating of Embodiment 3.

A preparation method for the molten Al—Si alloy corrosion resistant composite coating of this comparative example, characterized by excluding the step (6), based on comparison with the composite coating of Embodiment 3.

Figure 1A:
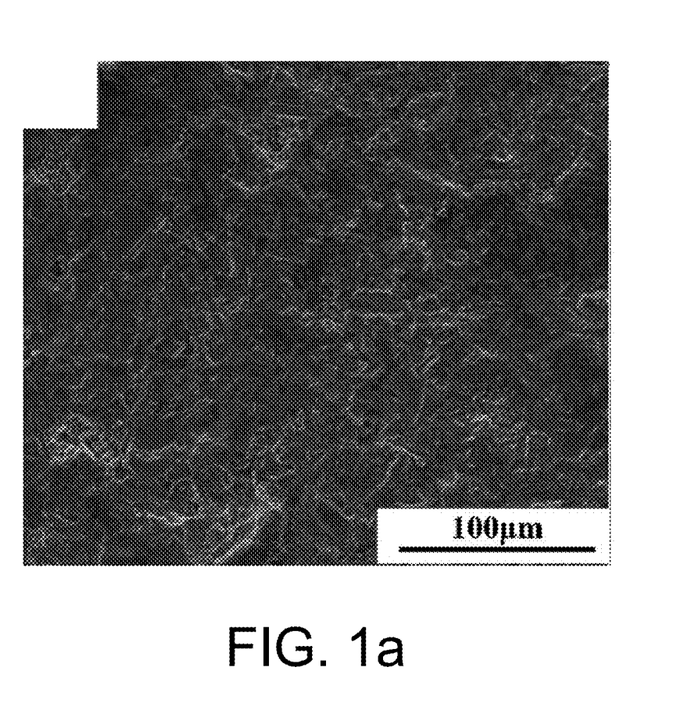
FIG. 1a to 1c illustrate a section morphology of an aluminized steel after subjecting to atom layer vapor deposition compared with the aluminized steel before subjecting to atom layer vapor deposition in Embodiment 3 of the present invention and an EDS energy spectrum analysis diagram of a corresponding point.
Figure 1B:
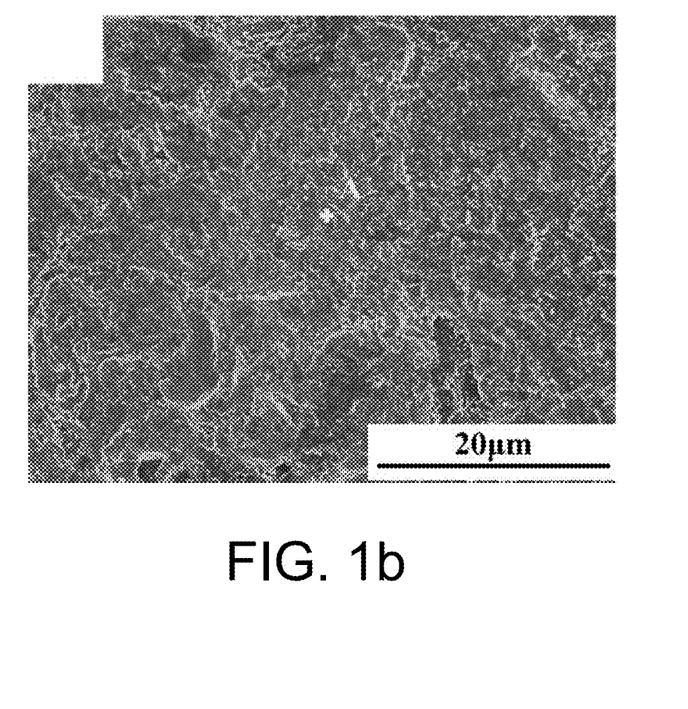
Figure 1C:
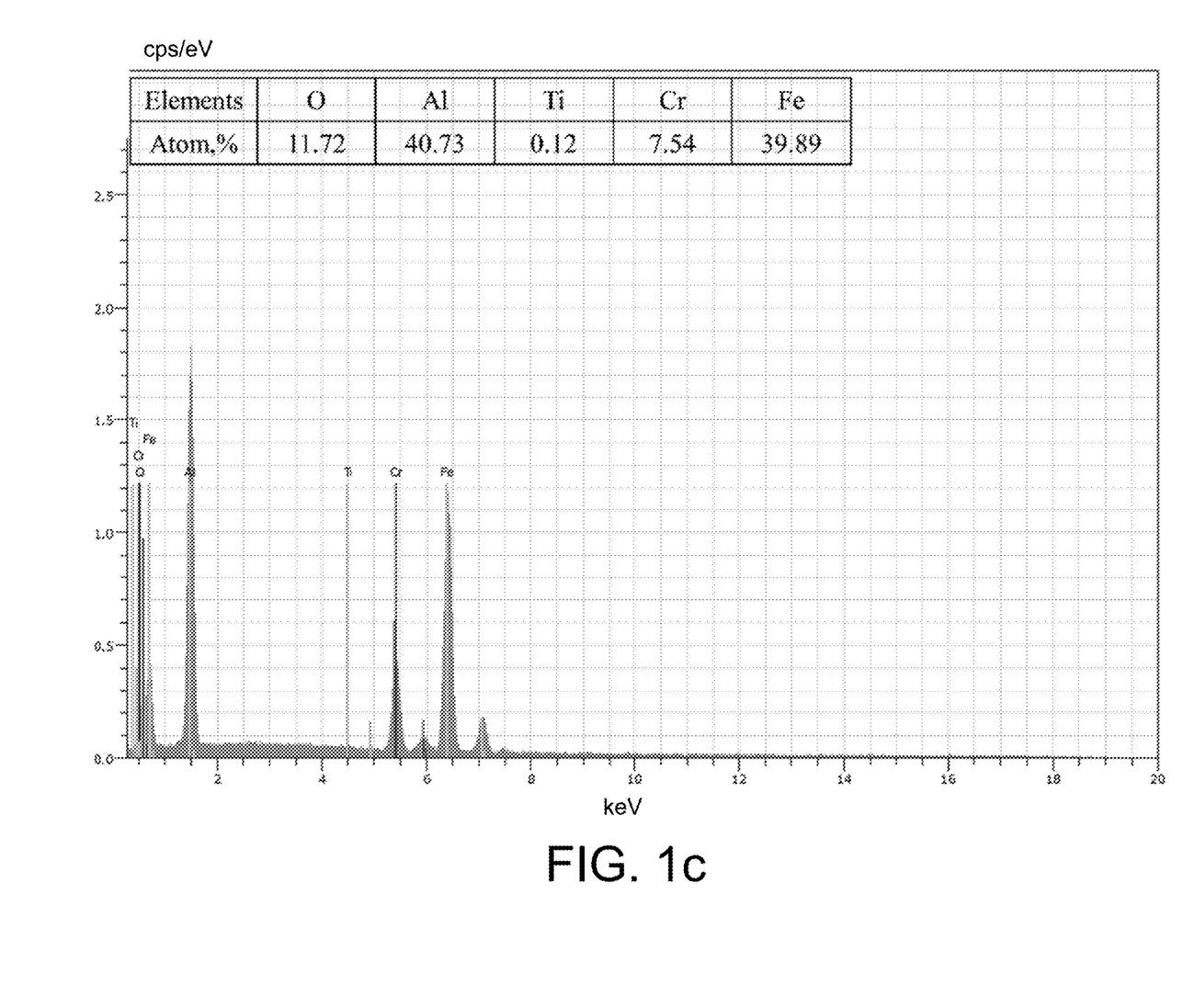

FIG. 1b shows the results of SEM analysis on the surface of the composite coating obtained in Embodiment 3. There is no significant difference in surface topography between the composite coating and the aluminized steel prior to the atom layer vapor deposition (FIG. 1a), indicating that the atom layer vapor deposition makes no change to the aluminized surface structure. The energy spectrum analysis was carried out on point A in FIG. 1b to detect Fe, Cr, Al, Ti and O atoms. In addition to the atoms existing in the coating, the Cr atom and the Fe atom in the substrate material were observed as an EDS penetrated into the substrate. Only trace amount of Ti element was measured by means of the EDS since the $TiO_2$ in nano-scaled thickness was introduced by means of the atom layer vapor deposition.

Figure 2:
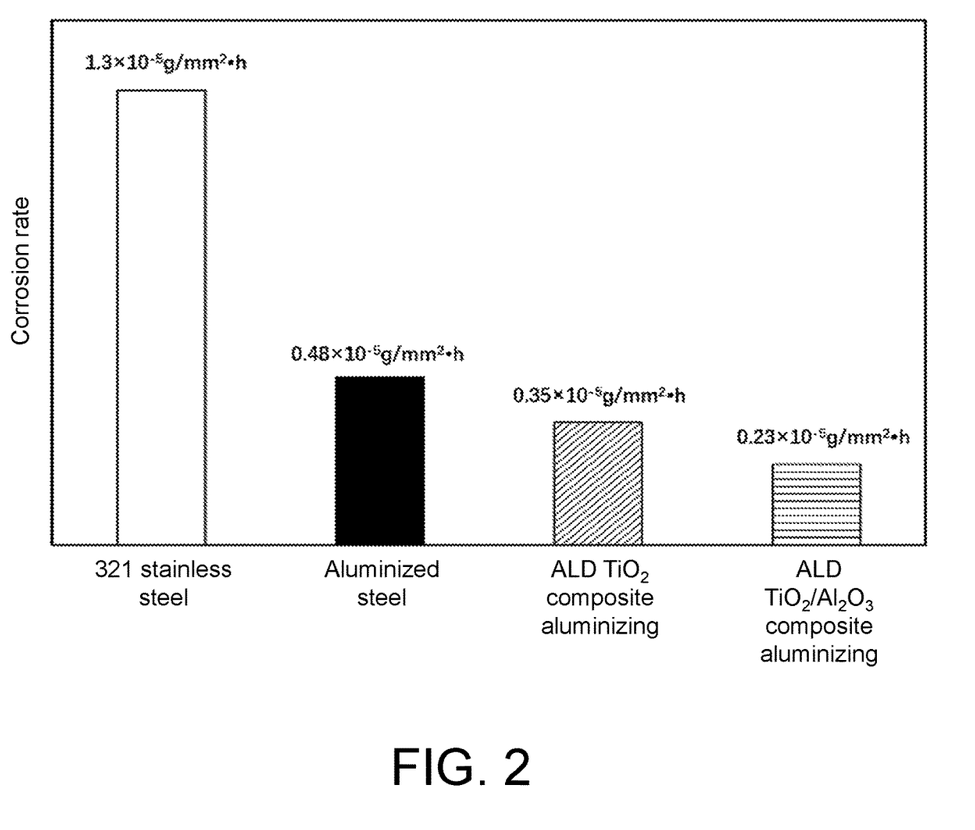
FIG. 2 illustrates corrosion rate comparison between a stainless steel containing a composite coating prepared in Embodiments 3 and 4 of the present invention, a stainless steel excluding a coating and a stainless steel containing an aluminized layer prepared in comparative example 1, all of which corrode for 72 h in the molten Al—Si.

FIG. 2 is a histogram of corrosion rates of the 321 stainless steel containing the ALD $Al_2O_3/TiO_2$ composite aluminized coating of Embodiment 3, the 321 stainless steel containing the ALD $TiO_2$ composite aluminized coating of example 4, as well as the 321 stainless steel containing the aluminized layer and the 321 stainless steel without the coating of comparative example 1, in the presence of the molten Al—Si alloy at 620° C. for 72 hours.

The corrosion with extents varying with corrosion time on the metal test piece is measured by means of a weight loss method. The extent of corrosion on materials is directly characterized by the weight loss of the test piece. The metal test piece corrosivity is evaluated based on the corrosion rate V(g/mm²·h), as shown in Formula (1):

$$V = \frac{W^0 - W}{A \times t} \quad (1)$$

In the above formula, A means the surface area of the test piece (mm²); Wo means the mass of the test piece before corrosion (g); W means the mass of the test piece after corrosion (g); t means the corrosion time (h). As shown in FIG. 2, compared with the corrosion rate of the stainless steel resistant to the molten Al—Si alloy, it seems that the corrosion rate of the test piece with a single aluminized coating decreases by 63.1%, the test piece with an ALD TiO₂ composite aluminized coating decreases by 73.1%, and the test piece with an ALD Al₂O₃/TiO₂ composite aluminized coating decreases by 82.3%. Therefore, the composite coating provided by the present invention has high resistance to corrosion of the molten Al—Si alloy. In addition, the coating introduced by means of the ALD Al₂O₃/TiO₂ composite aluminizing shows a greater improvement in the resistance to corrosion than that introduced by means of the ALD TiO₂ composite aluminizing, and satisfies the compatibility of the molten Al—Si alloy (as the heat reservoir medium) to the heat exchange tube for solar thermal power generation.

The above examples are only preferred embodiments of the present invention and not used to limit the present invention. Any person skilled in the art, without departing from the scope of the technical solution of the present invention, is capable of taking advantage of the above-described technical content to make a plurality of possible variations and modifications of the technical solution, or equivalent embodiments with equivalent changes. Therefore, all the contents without departing from the technical solution of the present invention, based on any simple modification, equivalent variations and modifications made by the technical spirit of the present invention for the above embodiments, would be incorporated in the protection range of the technical solution of the present invention.

What is claimed is:

1. A preparation method for the molten Al—Si alloy corrosion resistant composite coating, wherein the composite coating comprises an aluminized layer and a TiO₂ film layer from a surface of a substrate to the outside in sequence, the composite coating further comprises an Al₂O₃ film layer prepared by an atom layer vapor deposition, and the Al2O3 film layer is located between the TiO₂ film layer and the aluminized layer, wherein comprising the following steps:
   step S1: making a surface treatment to an Fe-based alloy, and then aluminizing with a solid powder penetrant;
   step S2: sand-blasting the aluminized Fe-based alloy;
   step S3: washing and drying the Fe-based alloy which has been sand-blasted; and
   step S4: depositing the TiO₂ film layer on a surface of the dried aluminized Fe-based alloy by using an atom layer vapor deposition.

2. The preparation method for the molten Al—Si alloy corrosion resistant composite coating according to claim 1, wherein further comprises depositing the Al₂O₃ film layer onto a surface of the aluminized Fe-based alloy in step S3 using an atom layer vapor deposition between the step S3 and the step S4.

3. The preparation method for the molten Al—Si alloy corrosion resistant composite coating according to claim 2, wherein the step of depositing the Al₂O₃ film layer comprises: taking trimethyl aluminum as a precursor and pressure as 0.05-0.2 ton, inflating for 0.01-0.03 s, and then exhausting air for 40-60 s, charging vapor for 0.01-0.03 s, and finally exhausting air for 20-60 s, and repeating trimethyl aluminum inflating-exhausting air-vapor charging-exhausting air to deposit the Al₂O₃ film layer; wherein the repeating times are 50-500 times.

4. The preparation method for the molten Al—Si alloy corrosion resistant composite coating according to claim 1, wherein in the step S1, the solid powder penetrant is a homogeneous mixture comprising the following ingredients: an aluminum powder with a granularity of 200 meshes, a filler consisting of a Al₂O₃ powder and a Cr powder and a powdery NH₄Cl penetration aid, wherein the solid powder penetrant, by mass, comprises 42-74% of the aluminum powder, 20-40% of the Al₂O₃ powder, 5-15% of the Cr powder and 1-3% of the NH₄Cl,
   the aluminizing conditions include: maintaining a temperature at 400-600° C. for 20-40 min, and then maintaining a temperature at 900° C-1050° C. for 10-15 h, and finally cooling to a room temperature along with a furnace.

5. The preparation method for the molten Al—Si alloy corrosion resistant composite coating according to claim 1, wherein in the step S3, the step of depositing the TiO₂ film layer comprises: taking titanium isopropylate as a precursor and pressure as 0.1-0.3 torr, inflating for 0.1-0.5 s, exhausting air for 30-50s, charging plasma vapor for 0.01-0.03 s, and finally exhausting air for 30-50s and repeating titanium isopropylate inflating-exhausting air-vapor charging-exhausting air for recycling to deposit the TiO₂ film layer, wherein the repeating times are 50-500 times.

6. The preparation method for the molten Al—Si alloy corrosion resistant composite coating according to claim 1, wherein in the step S2, the sand-blasting is conducted at a high pressure nitrogen of 0.6-0.9 MPa, the sand-blasting time is 5-20 min, the sand-blasting abrasive is Al₂O₃ particles with 300-500 meshes, and the sand-blasting distance is 2-6 cm,
   in the step S1, the surface treatment includes mechanical polishing for the Fe-based alloy before electrolytic polishing, the mechanical polishing comprises:
   polishing without visually obvious scratches by using an abrasive paper with a granularity of 80-1,200 meshes, ultrasonically washing for 5-20 min with acetone, and then ultrasonically washing with anhydrous ethanol for 5-20 min, and finally drying, the electrolytic polishing means electrolytically polishing an Fe base by taking the Fe-based alloy as an anode and an insoluble conductive material as a cathode, the electrolytic polishing electrolyte comprises concentrated sulfuric acid with a volume fraction of 60-80%, concentrated phosphoric acid with a volume fraction of 15-37% and distilled water with a volume fraction of 3-5%, the electrolytic DC voltage is 5-6 V, the temperature of the electrolyte is 60-80° C., and the electrolytic polishing time is 2-5 min.

7. A preparation method for the molten Al—Si alloy corrosion resistant composite coating, wherein the composite coating comprises an aluminized layer and a TiO₂ film layer from a surface of a substrate to the outside in sequence, the composite coating further comprises an Al₂O₃ film layer prepared by an atom layer vapor deposition, and the Al₂O₃ film layer is located between the TiO₂ film layer and the aluminized layer, wherein the aluminized layer comprises an Fe(Al) phase diffusion layer, an Fe-Al compound layer and an $Al_2O_3$ layer from the substrate to the outside in sequence, wherein comprising the following steps:

- step S1: making a surface treatment to an Fe-based alloy, and then aluminizing with a solid powder penetrant;
- step S2: sand-blasting the aluminized Fe-based alloy;
- step S3: washing and drying the Fe-based alloy which has been sand-blasted; and
- step S4: depositing the $TiO_2$ film layer on a surface of the dried aluminized Fe-based alloy by using an atom layer vapor deposition.

* * * * *